United States Patent
Nagtegaal

Patent Number: 6,044,210
Date of Patent: Mar. 28, 2000

[54] COMPUTER PROCESS FOR PRESCRIBING SECOND-ORDER TETRAHEDRAL ELEMENTS DURING DEFORMATION SIMULATION IN THE DESIGN ANALYSIS OF STRUCTURES

[75] Inventor: Joop C. Nagtegaal, Barrington, R.I.

[73] Assignee: Hibbitt Karlsson & Sorensen, Inc., Pawtucket, R.I.

[21] Appl. No.: 08/870,236

[22] Filed: Jun. 5, 1997

[51] Int. Cl.[7] .............................. G06F 17/50; G06F 17/10; G06G 7/48

[52] U.S. Cl. .................................. 395/500.1; 395/500.28; 395/500.23

[58] Field of Search ........................ 364/578; 395/500.23, 395/500.28, 500.1

[56] References Cited

PUBLICATIONS

ABAQUS Theory Manual, Version 5.5., Hibbitt, Karlsson & Sorensen, Inc. 1995.
ABAQUS/Standard User's Manual, vol. I, Version 5.5, Hibbitt, Karlsson & Sorensen, Inc. 1995.
ABAQUS/Standard User's Manual, vol. II, Version 5.5, Hibbitt, Karlsson & Sorensen, Inc. 1995.
ABAQUS/Standard Verification Manual, Version 5.5, Hibbitt, Karlsson & Sorensen, Inc. 1995.
ABAQUS/Standard Example Problems Manual, vol. I, Version 5.5, Hibbitt, Karlsson & Sorensen, Inc. 1995.
ABAQUS/Post Manual, Version 5.5, Hibbitt, Karlsson & Sorensen, 1995.
Cavendish et al., An Approach to Automatic Three–Dimensional Finite Element Mesh Generation, Int. J. Num. Meth. Eng.; vol. 21, p. 329–347, 1985.
Downloaded material from the website maintained by Hibbitt, Karlsson & Sorensen, Inc, 1996.

*Primary Examiner*—Kevin J. Teska
*Assistant Examiner*—Hugh Jones
*Attorney, Agent, or Firm*—Irah H. Donner; Suresh Koshy; Pepper Hamilton LLP

[57] ABSTRACT

A computer implemented process prescribes second-order tetrahedral elements during simulation in the design analysis of structure. The computer implemented process includes the steps of defining a finite element model for an element including at least one tetrahedral element, and defining the at least one tetrahedral element as a combination of hexahedral sub-elements. The computer implemented process also includes the steps of executing the simulation, and evaluating the structure for structural integrity responsive thereto.

25 Claims, 13 Drawing Sheets

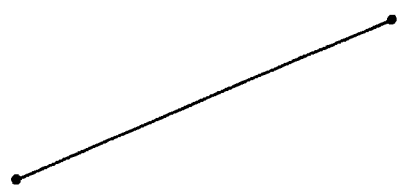
FIG. IA
PRIOR ART
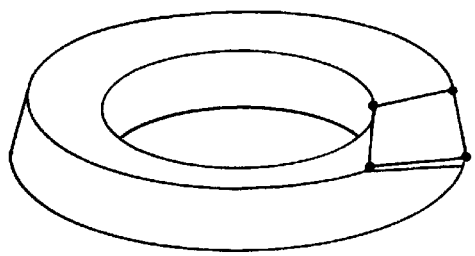
FIG. IB
PRIOR ART
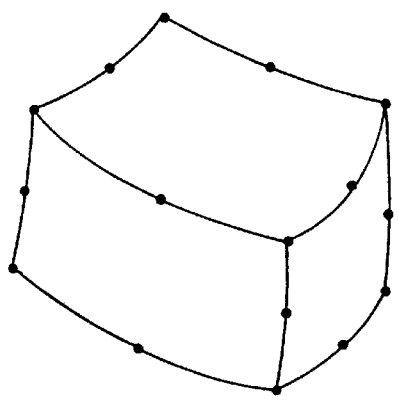
FIG. IC
PRIOR ART
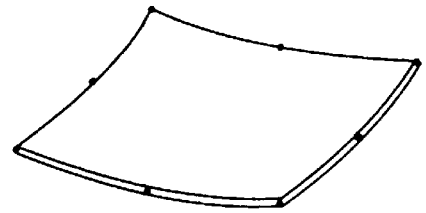
FIG. ID
PRIOR ART

COMPUTER PROCESS FOR PRESCRIBING SECOND-ORDER TETRAHEDRAL ELEMENTS DURING DEFORMATION SIMULATION IN THE DESIGN ANALYSIS OF STRUCTURES

FIELD OF THE INVENTION

The present invention is generally related to analysis of structural integrity of structures via computer implemented simulation, and more particularly to analysis and design of integrity of structures via computer implemented simulation by prescribing modified second-order tetrahedral elements during small and finite deformation.

BACKGROUND OF THE RELATED ART

The last two decades have seen major changes in the application of the finite element method. During the seventies the range of elements and their performance was improved. Application of the method was still fairly new and the learning curve was steep. Much of the change, particularly in the functionality of programs, was influenced by response from the growing number of users. The advances in the eighties were greatly influenced by the increased power and reduced cost of computers, and the development of computer graphics.

Development of solution techniques slowed, but powerful graphics-based techniques for the modeling of complex structures were developed. Computer power hungry techniques for the solution of nonlinear problems became a practical reality. Development in the nineties has been dominated by the automation of the modeling process, involving adaptive mesh refinement and design optimization. These have led to a return to the theory to establish error estimating techniques.

The Finite Element (FE) method has been used with great success to solve many types of problems including:

stress analysis dynamic response heat transfer

In recent years there has been an increasing requirement for structures and safety related equipment to be seismically qualified. Smaller items can be tested on shake tables on which they are subjected to dynamic loading, simulating the effect of an earthquake. Large structures cannot undergo this type of test and it is necessary to simulate the behavior analytically, often using the FE technique.

Destructive testing and service failures often provide very limited information. They may show the weakest part of a structure but give no clear indication of the most effective remedial action, where another failure might occur after redesign, or where material could be removed without detriment.

A similar approach was adopted in the analysis of certain types of structures, such as building frames, process piping and aircraft structures. The structure was broken down into smaller parts or elements for which exact results were available, and the behavior of the structure as a whole found by the solution of a set of simultaneous equations.

Although originally intended to represent sections of structures which were in reality quite discrete, the early elements were used with considerable success to analyze more general structures. Modern, general-purpose finite element programs have libraries of elements which permit many different geometries to be modeled. They can be broken down into four main categories:

line elements, such as beams, struts and pipes two-dimensional solid elements for modeling plane strain and axisymmetry three-dimensional solid elements for modeling any solid shape shell elements suitable for modeling thin structures.

Common finite elements are illustrated in FIGS. 1A–1D, and examples of their use in structures are shown in FIGS. 2A–2D.

Three-dimensional solid elements are probably the simplest to understand. As in the earlier methods described above, the structure is represented by an assemblage of notional elements, which, for the sake of visualization, may be likened to building blocks.

Unlike an element that is exact, the stiffness of solid elements are calculated approximately by numerical integration, based on assumptions about how the element deforms under loads at the node points. Providing that the elements are sufficiently small, the error due to these approximations is acceptable.

For design by analysis it is necessary to postulate sizes and thicknesses first, and then calculate the stresses. The process is frequently iterative, with changes of size or thicknesses in each loop until a satisfactory or optimized design is achieved. The finite element method lends itself readily to this process since it is often possible to change just a single or few numerical values in the input data to change sizes or thicknesses.

One computer simulation process used for structural design is the use of tetrahedral elements in the finite element analysis and simulation of structures. This is particularly desirable because automatic mesh-generation techniques are now available to subdivide general objects of any shape into meshes of tetrahedral elements. Second-order tetrahedral elements usually give accurate results in small and finite deformation problems with no contact. However, I have discovered that these elements are not appropriate for contact problems because in uniform pressure situations the contact forces are non-uniform at the corner and midside nodes.

I have also discovered that, for second-order tetrahedra, the contact forces at the corner nodes are zero, while the midside nodes carry all the contact load. The zero contact forces at the corner nodes in the tetrahedra result in zero contact pressures. As an additional complication, I have determined that non-convergence of contact conditions may result with second-order tetrahedral elements. I have also discovered that the second-order tetrahedra elements may exhibit significant volumetric locking when incompressibility is approached.

In comparison, the first-order tetrahedra produce uniform contact forces and pressures, but overall results can be very inaccurate due to severe volumetric and shear locking. In addition, very fine meshes may be needed for first-order tetrahedra elements to attain results of sufficient accuracy.

I have also realized that it is desirable to simulate and analyze the structural integrity of structures via computer implemented simulation by prescribing modified second-order tetrahedral elements during small and finite deformation.

I have also realized that it is desirable to simulate and analyze the structural integrity of structures by prescribing modified second-order tetrahedral elements that provide robustness and convergence for contact simulations.

I have also realized that it is desirable to utilize second-order tetrahedra elements that minimize volumetric locking when incompressibility is approached.

SUMMARY OF THE INVENTION

It is a feature and advantage of the present invention to simulate and analyze of structural integrity structures via computer implemented simulation.

It is another feature and advantage of the present invention to simulate and analyze the structural integrity of structures via computer implemented simulation by prescribing modified second-order tetrahedral elements during small and finite deformation.

It is another feature and advantage of the present invention to simulate and analyze the structural integrity of structures by prescribing modified second-order tetrahedral elements that provide robustness and convergence for contact simulations.

It is another feature and advantage of the present invention to utilize second-order tetrahedra elements that minimize volumetric locking when incompressibility is approached.

The present invention utilizes finite element analysis to provide the additional simulation benefits of:

optimization of product performance optimization of product cost reduction of development time elimination of reduction of testing achievement of required quality first time improved safety satisfaction of design codes improved information for engineering decisions fuller understanding of components allowing more rational design The present invention is based, in part, on our discovery of a formulation of a modified second-order tetrahedral element which addresses the shortcomings mentioned above. The element gives rise to uniform contact forces and pressures, exhibits minimal shear and volumetric locking, and is robust during finite deformation. A satisfactory "lumped" mass matrix can also be generated for dynamic applications. In addition, a hybrid version of this element is provided for use with incompressible and nearly incompressible constitutive models.

The present invention is also based, in part, on our discovery that it is possible to use a combination of hexahedral elements, while the user only sees or deals with a second-order tetrahedral element. Advantageously, I have divided or broken the standard tetrahedral object into four hexahedral objects. The user sees the second-order tetrahedral element with four vertices, and six mid-edge points.

The computer simulation advantageously constrains the four points that are located in the mid-faces of the tetrahedral elements to the three vertices and three mid-edge points associated with the faces of the tetrahedral element.

The computer simulation advantageously indirectly constrains the midbody point using an hourglass technique, instead of placing direct constraints thereon. The use of the hourglass control greatly relieves volumetric and shear locking, thereby facilitating convergence, resulting in a robust family of modified second-order tetrahedral elements. The present invention thus provides simulation of a second-order tetrahedra using a combination of hexahedral finite elements with constraints on the four mid-face points and the mid-body point.

In accordance with one embodiment of the invention, a computer implemented process prescribes second-order tetrahedral elements during simulation in the design analysis of structure. The computer implemented process includes the steps of defining a finite element model for an object including at least one tetrahedral element, and defining the at least one tetrahedral element as a combination of hexahedral sub-elements. The computer implemented process also includes the steps of executing the simulation, and evaluating the structure for structural integrity responsive thereto.

In accordance with another embodiment, a computer readable tangible medium stores instructions for implementing a process driven by a computer. The instructions control the computer to perform the process of prescribing second-order tetrahedral elements during small or finite deformation simulation in the design analysis of structures, as described in detail below.

These together with other objects and advantages which will be subsequently apparent, reside in the details of construction and operation as more fully herein described and claimed, with reference being had to the accompanying drawings forming a part hereof wherein like numerals refer to like elements throughout.

BRIEF DESCRIPTION OF THE DRAWINGS

FIGS. 1A–1D are example s of finite elements used in finite element simulations;

NOTATIONS AND NOMENCLATURE

Figure 2B:
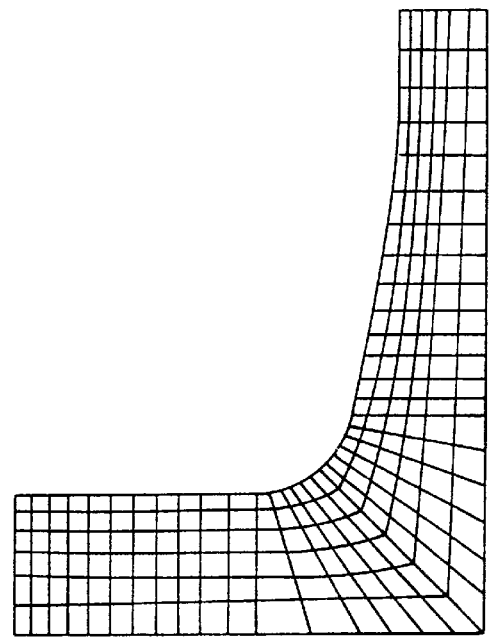
FIGS. 2A–2D are examples of the use of finite elements to model different structures.
Figure 2A:
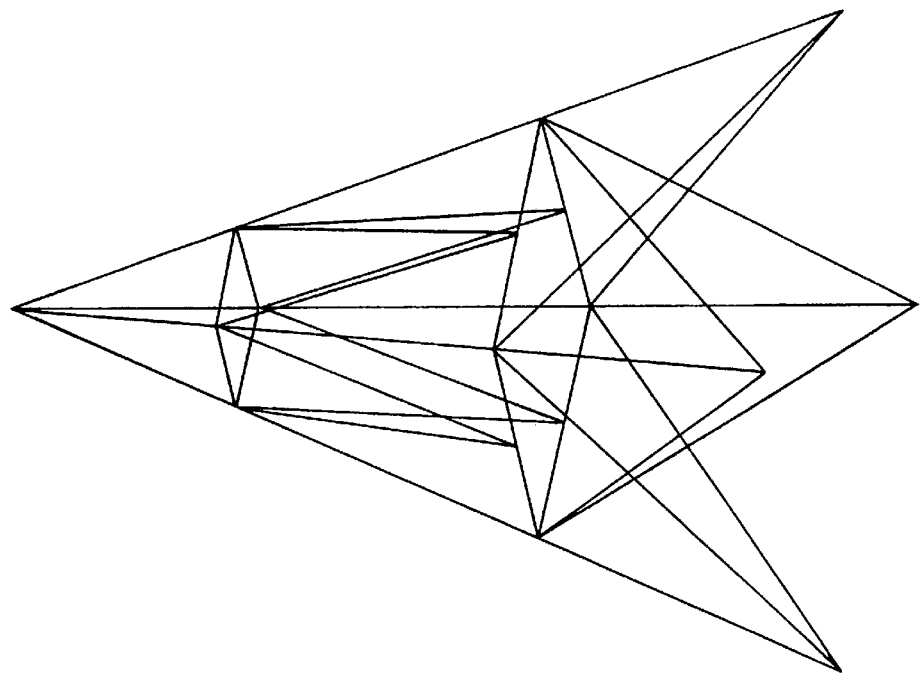
Figure 2D:
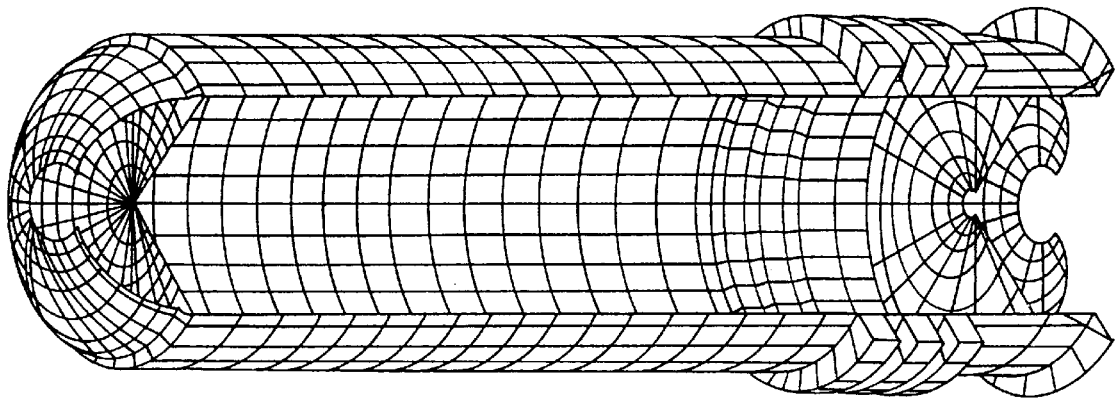
Figure 2C:
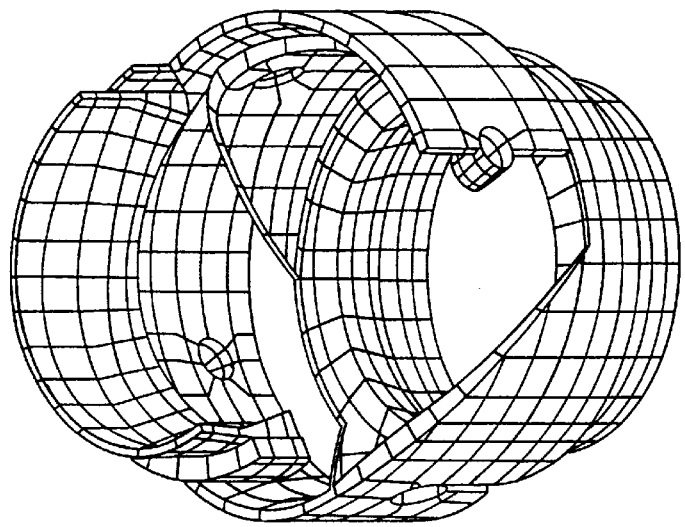

The detailed descriptions which follow may be presented in terms of program procedures executed on a computer or network of computers. These procedural descriptions and representations are the means used by those skilled in the art to most effectively convey the substance of their work to others skilled in the art.

A procedure is here, and generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared and otherwise manipulated. It proves convenient at times, principally for reasons of common usage, to refer to these signals as bits, values, elements, symbols, characters, terms, numbers, or the like. It should be noted, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operation of the present invention include general purpose digital computers or similar devices.

The present invention also relates to apparatus for performing these operations. This apparatus may be specially constructed for the required purpose or it may comprise a general purpose computer as selectively activated or reconfigured by a computer program stored in the computer. The procedures presented herein are not inherently related to a particular computer or other apparatus. Various general purpose machines may be used with programs written in accordance with the teachings herein, or it may prove more convenient to construct more specialized apparatus to perform the required method steps. The required structure for a variety of these machines will appear from the description given.

Best Mode for Carrying Out the Invention

Second-order tetrahedral elements usually give accurate results in small and finite deformation problems with no contact. However, I have determined that these elements are not appropriate for contact problems because in uniform pressure situations, the contact forces are non-uniform at the corner and midside nodes. I have further determined that equisized tetrahedra have zero contact forces at the corner nodes, so that the midside nodes carry all the contact load.

Non-convergence of contact conditions may result especially with second-order tetrahedral elements. The second-order tetrahedral elements may also exhibit significant volumetric locking when incompressibility is approached.

In comparison, first-order tetrahedral elements produce uniform contact forces and pressures, but overall results can be very inaccurate due to severe volumetric and shear locking. In addition, very fine meshes may be needed to attain results of sufficient accuracy.

I have determined a formulation for a modified second-order tetrahedral element which addresses the shortcomings mentioned above. The elements give rise to uniform contact forces and pressures, exhibit minimal shear and volumetric locking, and are robust during finite deformation. We have further determined that satisfactory "lumped" mass matrices can be generated for dynamic applications. In addition, hybrid versions of these elements are provided for use with incompressible and nearly incompressible constitutive models. See Section 3.2.3 in the ABAQUS Theory Manual, publicly available from Hibbitt, Karlsson & Sorensen, Inc. in Pawtucket, R.I., for a detailed discussion of the hybrid formulation used; the entire Theory Manual is hereby incorporated herein by reference.

I have also discovered that it is possible to use a combination of hexahedral elements, while the user only sees or deals with a second-order tetrahedra element. Advantageously, I have divided or broken the standard tetrahedra object into four hexahedral objects. The user sees the second-order tetrahedral element with four vertices, and six mid-edge points. This process is described below in detail.

Figure 3:
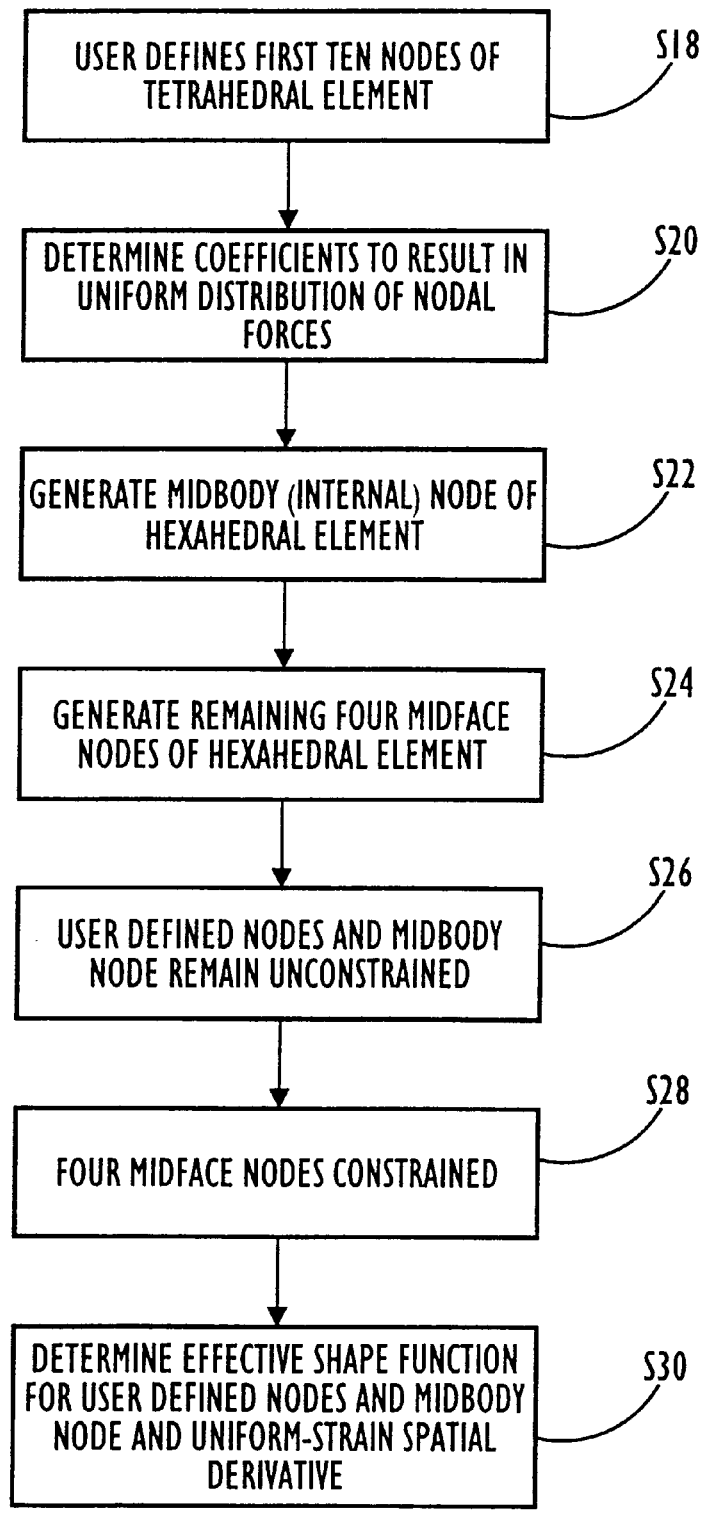
FIG. 3 is an illustration of the computer process for prescribing a modified second-order tetrahedral element for the finite element simulation.
Figure 4:
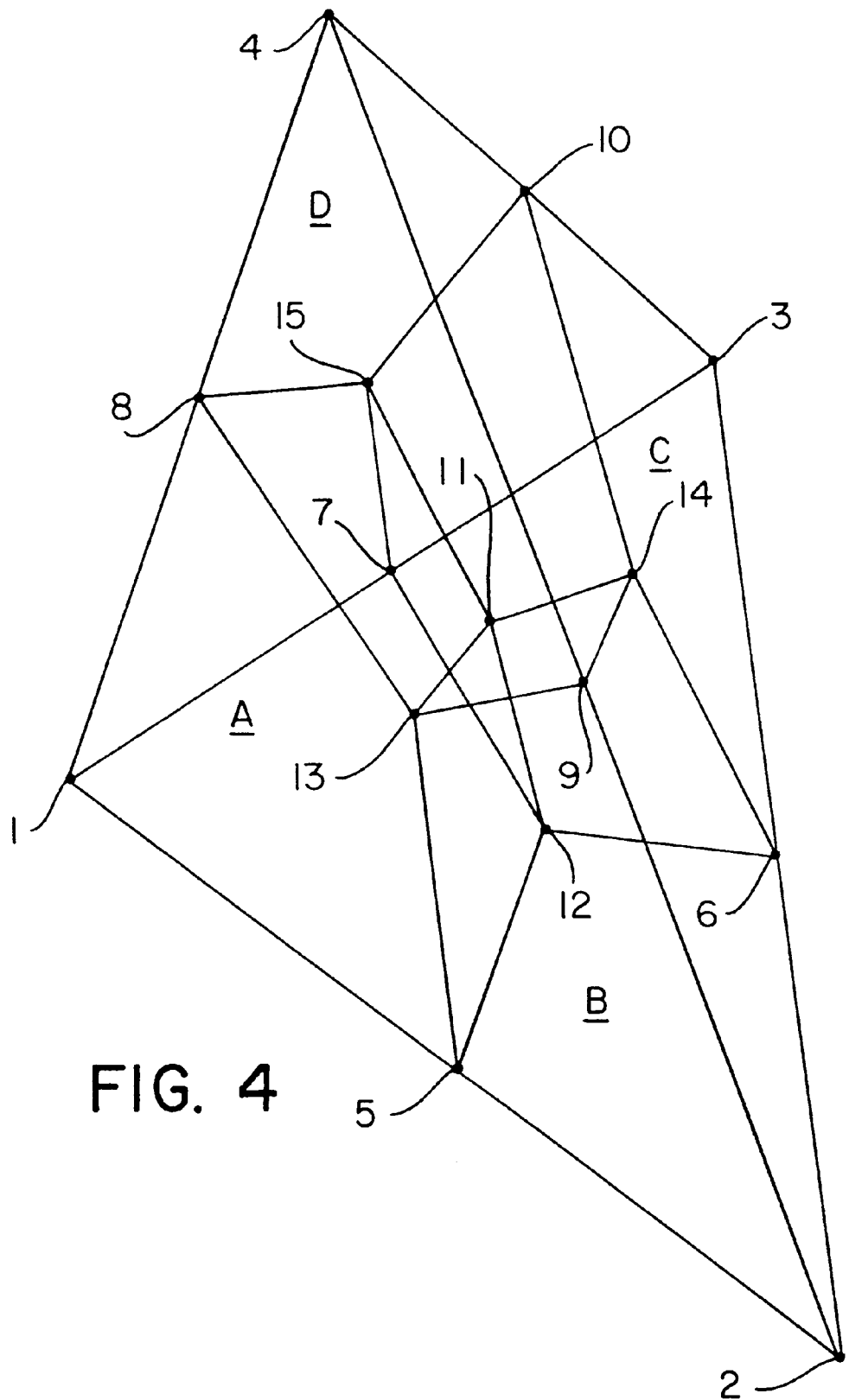
FIG. 4 is an illustration of a tetrahedral element divided into hexahedral elements for the finite element simulation.

FIG. 3 is an illustration of the computer process for the formulation of modified second-order tetrahedral elements. In FIG. 3, the tetrahedral elements are constructed in a composite manner; that is, they are composed of sub-elements that are hexahedral elements. The tetrahedral element is composed of four uniform-strain hexahedra and fifteen nodes as illustrated in FIG. 4. The first ten nodes (corner and mid-edge nodes) are defined by the user in Step S18, and the last five nodes (mid-body and mid-face nodes) are defined and tracked by the computer process described herein.

The mid-body node 11 has independent degrees of freedom, and its displacement are determined as part of the solution of the overall equation system, described herein. The displacements of each of the mid-face nodes 12 to 15 are dependent on the displacements of the corner and mid-edge nodes associated with the face.

Each hexahedral sub-element uses a uniform strain formulation, as originally developed by Flanagan and Belytschko, A Uniform Strain Hexahedron and Quadrilateral With Orthogonal Hourglass Control, International Journal for Numerical Methods in Engineering, vol. 17, pp.679–706 (1981), incorporated herein by reference. This formulation insures that the rate of strain used in the formulation of the element is the true volume average of the rate of strain in the element.

For use with hyperelastic materials, the Flanagan-Belytschko formulation has been extended to obtain a consistent expression for the average deformation gradient that properly describes the volume change of the element. The basic equations of the uniform strain hexahedron are described in the Flanagan-Belytschko reference.

In the hexahedral element of Flanagan-Belytschko, hourglass control is added to stabilize the element. In the hexahedral sub-element, the Flanagan-Belytschko hourglass control is omitted; instead, hourglass control is applied directly to the assembly of hexahedral elements described in detail below.

In Step S20, coefficients (e.g., $A_{tri}$, $B_{tri}$, $A_{tet}$, $B_{tet}$) to result in uniform distribution of nodal forces are determined. The coefficients $A_{tri}$, $B_{tri}$ have been determined analytically and numerically so that the equivalent nodal forces on the six external nodes of a face due to constant applied pressure on the face with a constrained mid-face node are uniform. The coefficients $A_{tet}$, $B_{tet}$ for the mid-body node have been determined numerically so that the equivalent nodal forces on the ten external nodes of the element due to a constant applied body force on the element with constrained mid-body and mid-face nodes are approximately uniform.

For the tetrahedron, the initial coordinates for the mid-body node 11 are determined in Step S22 by the linear equation:

$$X_{11} = A_{tet}(X_1 + X_2 + X_3 + X_4) + \quad (1)$$
$$B_{tet}(X_5 + X_6 + X_7 + X_8 + X_9 + X_{10})$$
$$= \sum_{(\text{for } I=1 \text{ to } 10)} \Gamma_I X_I$$

where $A_{tet} = -0.006803281$ and $B_{tet} = 0.162131146$.

The last four nodes of the tetrahedron (four midface nodes) are generated in Step S24 by constraining their coordinates at all times using the following set of equations:

$$x_{12} = A_{tri}(x_1+x_2+x_3) + B_{tri}(x_5+x_6+x_7)$$
$$x_{13} = A_{tri}(x_1+x_2+x_4) + B_{tri}(x_5+x_8+x_9)$$
$$x_{14} = A_{tri}(x_2+x_3+x_4) + B_{tri}(x_6+x_9+x_{10})$$
$$x_{15} = A_{tri}(x_1+x_3+x_4) + B_{tri}(x_7+x_8+x_{10}) \quad (2)$$

where $A_{tri} = 1/16$ and $B_{tri} = 2/5$. Hence, the displacement nodes 12 to 15 are beneficially determined by linear equations with the same coefficients as above.

I have discovered that constraining these four midface nodes (e.g., x12–x15) minimally increases the locking tendencies of the tetrahedron but improves its performance by reducing the number of hourglass modes. On the other hand, constraining the displacements of node 11 of the tetrahedron results in significant volumetric and shear locking, whereas leaving them as additional degrees of freedom greatly relieves the locking. I, therefore, have advantageously allowed the midbody node to remain unconstrained.

However, this approach is penalized by the presence of hourglass modes, necessitating some form of element hourglass control. To promote computational efficiency, the degrees of freedom of node 11 of the tetrahedron may be condensed and recovered at the element level for appropriate analysis procedures using the standard procedure.

Thus, the first eleven nodes of the tetrahedron are unconstrained, (e.g., 10 external nodes and one internal node) by the computer implemented process in Step S26; and the remaining four midface nodes are constrained in Step S28.

In Step S30, the effective shape function for the user defined and midbody nodes as well as the uniform-strain spatial derivative are determined. For the assembly of the tetrahedral elements, effective shape functions for nodes 1 to 11 are created with the linear constraints on the tetrahedral midface nodes. Consider the current position for a point in the first hexahedron of a tetrahedron:

$$x = N_1 x_1 + N_5 x_5 + N_{12} x_{12} + N_7 x_7 + N_8 x_8 + N_{13} x_{13} + N_{11} x_{11} + N_{15} x_{15} \quad (3)$$

where $N_I$ are the standard trilinear shape functions of the first hexahedron.

Substituting the expressions for the constrained coordinates x12, x13, and x15 from Equation (2) into Equation (3), provides:

$$X = N_1 X_1 + N_5 X_5 + N_7 X_7 + N_8 X_8 + N_{11} X_{11} + \quad (4)$$
$$N_{12}[A_{tri}(X_1 + X_2 + X_3) + B_{tri}(X_5 + X_6 + X_7)] +$$
$$N_{13}[A_{tri}(X_1 + X_2 + X_3) + B_{tri}(X_5 + X_6 + X_7)] +$$
$$N_{15}[A_{tri}(X_1 + X_2 + X_3) + B_{tri}(X_5 + X_6 + X_7)]$$

or upon rearranging, $$x = \Sigma_{(\text{for } I=1 \text{ to } 11)} N_I^{\text{eff}} x_I, \quad (5)$$

where $N_I^{\text{eff}}$ are the effective shape functions. For example, we can identify the effective shape function at node 1 as:

$$N_1^{\text{eff}} = N_1 + A_{tri}(N_{12} + N_{13} + N_{15}) \quad (6)$$

Its uniform-strain spatial derivatives (symbolized by an overbar) are then $$\overline{\frac{\partial N_1^{\text{eff}}}{\partial x}} = \overline{\frac{\partial N_1}{\partial x}} + A_{tri}\left(\overline{\frac{\partial N_{12}}{\partial x}} + \overline{\frac{\partial N_{13}}{\partial x}} + \overline{\frac{\partial N_{15}}{\partial x}}\right), \quad (7)$$

$$\overline{\frac{\partial N_I}{\partial x}} = \frac{1}{v^{se}} \int_{v^{se}} \frac{\partial N_I}{\partial x} dv^{se} \quad (8)$$

is evaluated over the current volume $v^{se}$ of the hexahedron sub-element se. The expression for x inside a hexahedron shows that the linear nodal constraints result in the coupling of all 10 user defined nodes and the mid-body node of the tetrahedron. The effective strain displacement matrix $B_I^{\text{eff}}$ for node I is then constructed with the standard procedure using the uniform strain spatial derivatives of the effective shape functions, $\overline{\delta N I^{\text{eff}}/\delta x}$.

Figure 5:
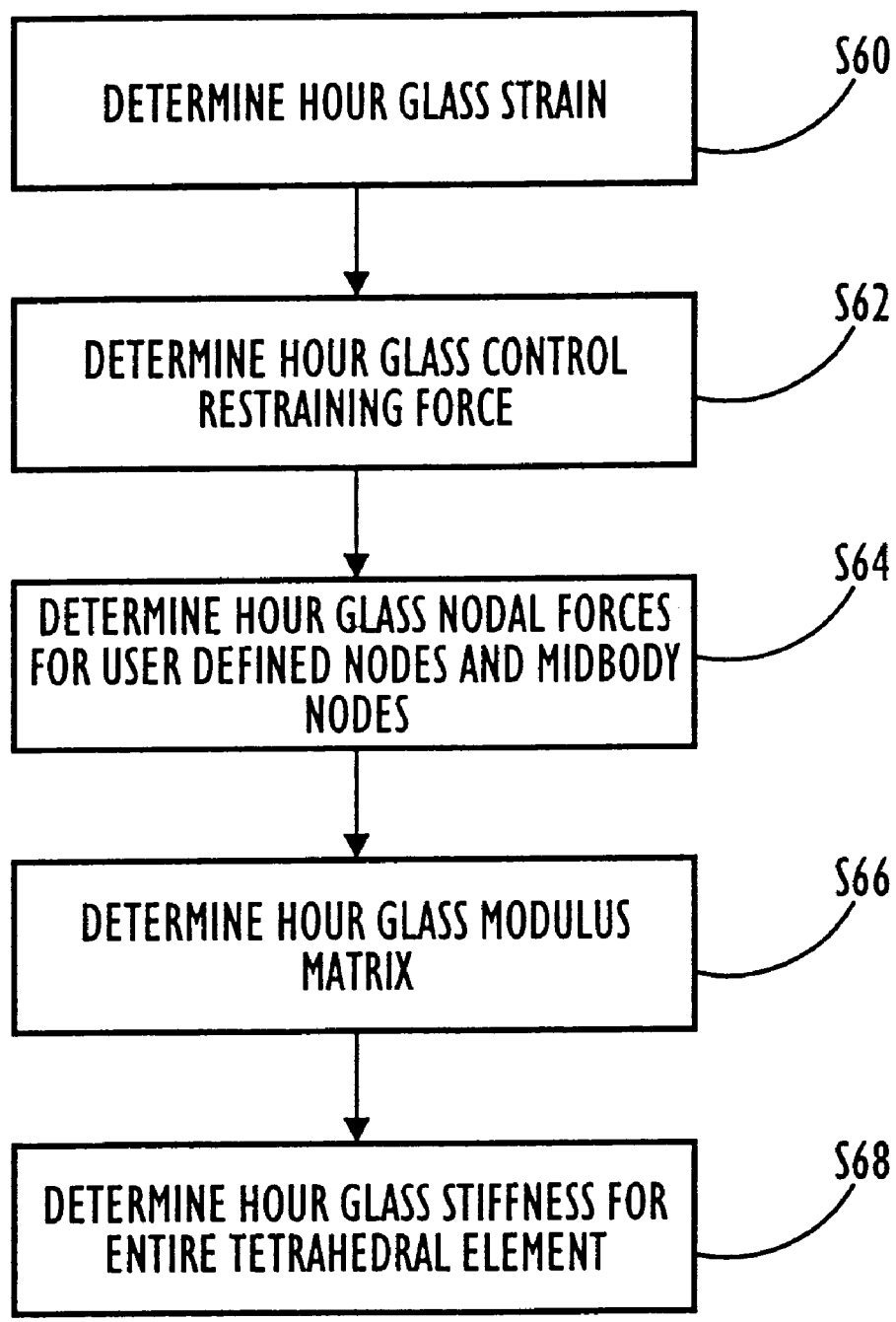
FIG. 5 is an illustration of the computer process for the hourglass control step.

FIG. 5 is an illustration of the computer process for the hourglass control step. Simple rigid body mode counts confirmed by eigenvalue analysis of single elements indicate the presence of three hourglass modes for the tetrahedral elements. Hourglass stiffness is added to these elements to suppress these modes. One alternative is to use the standard hourglass stiffness formulation used for the reduced integration uniform-strain hexahedra described by Flanagan and Belytschko. However, this scheme can add significantly to the element computational expense.

Instead, we introduce a more economical method which involves restraining the movement of the midbody node 11 from the position determined by the linear constraint equations (Equation (1)) given earlier for the midbody nodes. In this process, the hourglass strain $\Delta x^{HG}$ which is the difference between the actual position of the mid-body node and the position determined by the linear constraint equation is determined in Step S60 according to the following:

$$\Delta x^{HG} = -\sum_{I=1}^{11} \Gamma_I x_I, \quad (9)$$

where components 1 to 10 of the hourglass vector $\Gamma_I$ were defined above in equation (1) and $\Gamma_{11} = -1$. The hourglass control restraining force on the mid-body node is computed in Step S62 according to the following:

$$F^{HG} = \left[C_0 \frac{\Delta x^{HG}}{l} + \frac{\Delta x^{HG}}{\Delta x^{HG}} C_2 \left(\cosh\frac{C_1 \Delta x^{HG}}{l} - 1\right)\right] A_{\text{eff}}, \quad (10)$$

where $\Delta x^{HG} = |\Delta x^{HG}|$.

The parameter l provides a length scale and is equal to the circumscribed circle or sphere radius $r_{circum}$ of the tetrahedron. $A_{\text{eff}}$ is an effective area of the element through which the hourglass force acts and is equal to $\pi r^2_{inscr}$ for a tetrahedron, where $r_{inscr}$ is the inscribed circle or sphere radius of the triangle or tetrahedron. These choices for l and $A_{\text{eff}}$ do not cause any stiffening effects due to the hourglass stiffness when the aspect ratios of the elements become large.

When the aspect ratio of an element increases, $r_{inscr}$ decreases proportionally while $r_{circum}$ remains almost constant, thus causing the hourglass stiffness to decrease too. $C_0$ is the linear hourglass stiffness whose magnitude is of the order of Young's modulus or higher. $C_1$ and $C_2$ are the nonlinear hourglass control parameters where $C_2=C_0/C_1$, and $C_1$ is taken as 10.

The first term of the force $F^{HG}$ constitutes the constant hourglass stiffness contribution and is analogous to linear springs in fixed X, Y, and Z directions. The second term provides a nonlinear, rapidly increasing function of the hourglass strain $\Delta x^{HG}$, analogous to an axial, nonlinear spring. This hourglass control scheme thus selectively stiffens elements which are undergoing appreciable distortion, based on the midbody nodal displacements away from a mean position.

We have advantageously found this technique, using the parameters specified above, to be effective in preventing element interpenetration due to the movement of the mid-body node. Selectively stiffening elements is a better alternative to prescribing huge hourglass stiffness for all the elements, or using small and constant hourglass stiffness and allowing elements to distort and become invalid, resulting in the premature termination of the analysis.

The hourglass forces on the external nodes and the mid-body node can be determined according to the following in Step S64:

$$P_I^{HG}=-\Gamma_I F^{HG}, \text{ for } I=1,11. \tag{11}$$

The hourglass modulus matrix $D^{HG}$ is derived from $F^{HG}$ and has the form according to the following in Step S66:

$$D^{HG} = \left[C_0 \frac{I}{l} + \left(\frac{I}{\Delta x^{HG}} - \frac{\Delta x^{HG}\Delta x^{HG}}{(\Delta x^{HG})^3}\right)\left(\cosh\frac{C_1\Delta x^{HG}}{l} - 1\right) + \frac{\Delta x^{HG}\Delta x^{HG}}{(\Delta x^{HG})^2} \frac{C_1 C_2}{l} \sinh\frac{C_1\Delta x^{HG}}{l}\right]A_{\mathit{eff}}. \tag{12}$$

The element hourglass stiffness is computed according to the following in Step S68:

$$K_{IJ}^{HG}=\Gamma_I D^{HG}\sigma_J, \text{ for } I=1,11; J=1,11. \tag{13}$$

Figure 6:
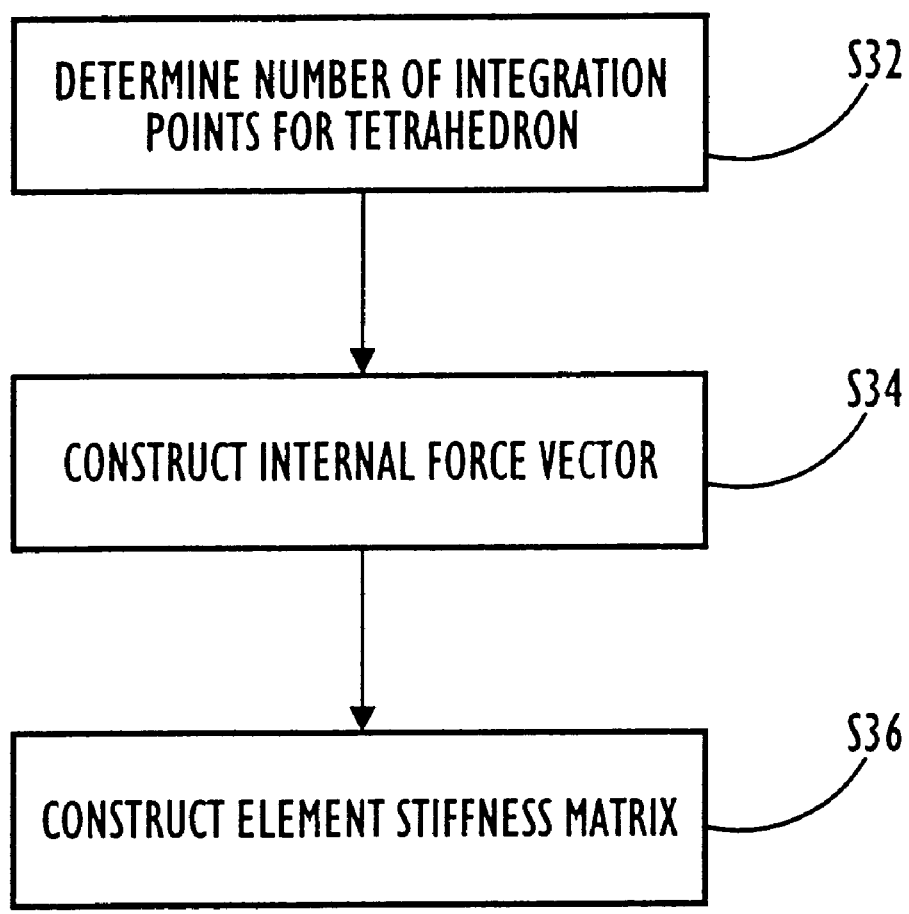
FIG. 6 is an illustration of the computer process for the stiffness integration step.

FIG. 6 is an illustration of the computer process for the force and stiffness integration step. In Step S32, the number of integration points are determined for the tetrahedron. Since each hexahedral sub-element (se) has only one integration point, the number of integration points is equal to the number of sub-elements; that is, four for the tetrahedron. The element internal force vector is assembled in Step S34 as:

$$P_I = \sum_{se} \overline{B}_I^{\mathit{eff}} \cdot \sigma^{se} v^{se} + P_I^{HG}, \tag{14}$$

where $\sigma^{se}$ is the uniform stress in sub-element se The element stiffness matrix is then constructed in Step S36 according to the following:

$$K_{IJ} = \sum_{se} \left(\overline{B}_I^{\mathit{eff}} \cdot D^{se} \cdot \overline{B}_J^{\mathit{eff}} v^{se} + K_{IJ}^{\sigma}\right) + K_{IJ}^{HG}, \tag{15}$$

where $D^{se}$ are the material moduli in sub-element se and $K^{\circ}_{IJ}$ is the initial stiffness matrix for the sub-element, constructed using the standard formulation for hexahedral elements (see ABAQUS Theory Manual at Section 3.2.2, incorporated by reference above), but using the uniform-strain spatial derivatives of the effective shape functions, $\overline{\delta N_I^{\mathit{eff}}/\delta x}$.

Figure 7:
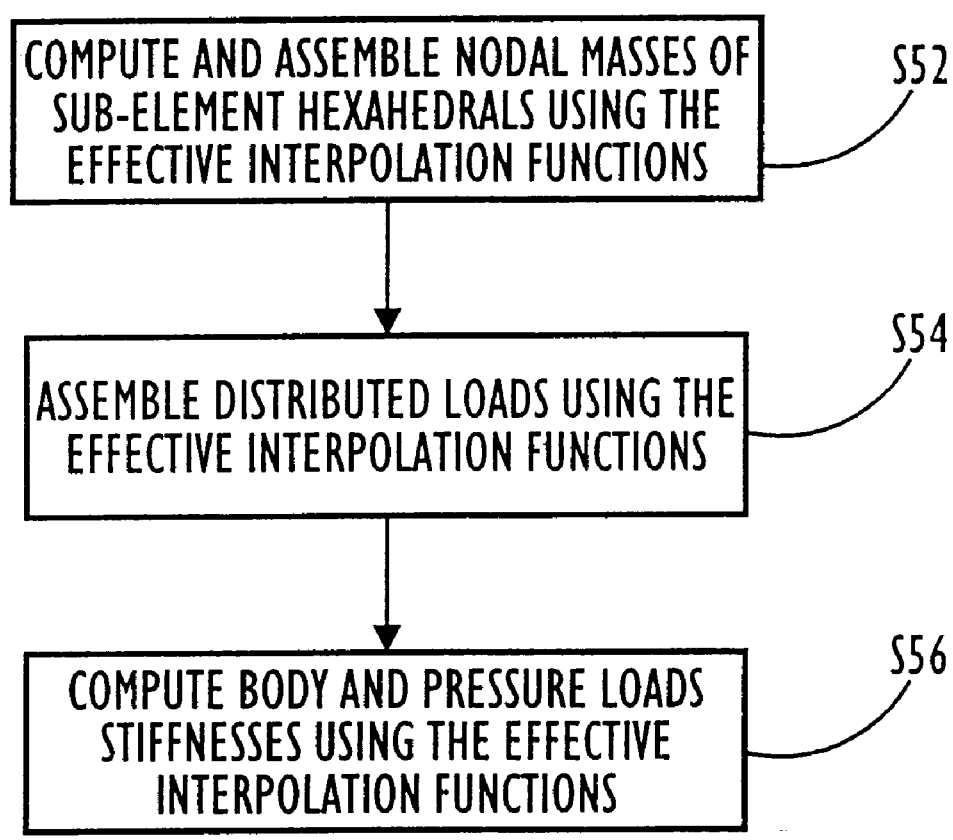
FIG. 7 is an illustration of the computer process for the computing of the lumped mass matrix and distributed loads step.

FIG. 7 is an illustration of the computer process for the mass matrices formation step. A mass lumping scheme is used to provide uniform nodal masses for tetrahedral elements used in dynamic analysis. The mass matrix is constructed as follows. The nodal masses of the hexahedral sub-elements are defined in Step S52 by she following lumping scheme:

$$m_I=\Sigma_{se}\int_{Vse}\rho N_I^{\mathit{eff}}dV^{se} \tag{16}$$

where $V^{se}$ is the original reference volume of the sub-element se and $\rho$ is the mass density of the material. It is important to note that by virtue of the construction of the effective interpolation functions $N_I^{\mathit{eff}}$, the lumped mass matrix has an optimal uniform distribution of the element mass over the nodes.

Distributed loads, including body and pressure loads, are computed in the standard manner using the effective interpolative functions in Step S54. In Step S56, the pressure and body load stiffnesses are computed in the standard manner implemented by ABAQUS (see Sections 3.2.10 and 6.1.1, incorporated herein by reference).

Figure 8:
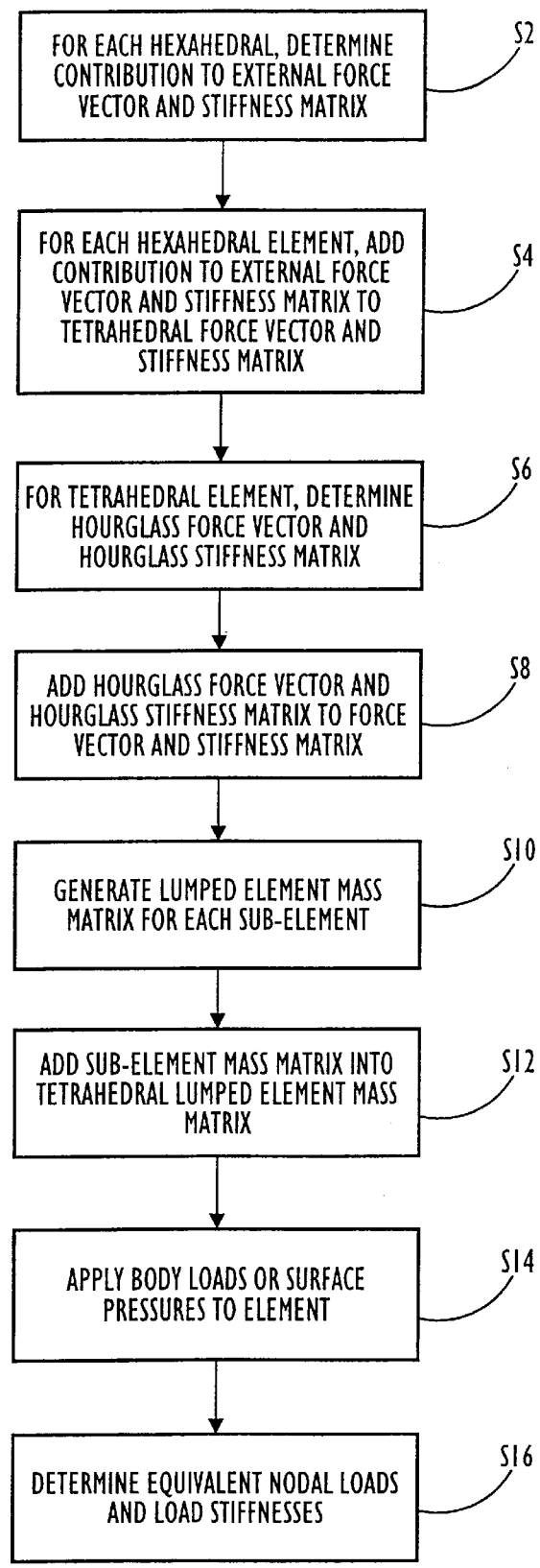
FIG. 8 is an illustration of the computer process for the implementation of the modified tetrahedral elements as an assembly of hexahedral sub-elements used in, for example, contact simulations or structural analysis.

FIG. 8 is an illustration of the computer process for the implementation of the modified tetrahedral elements used in, for example, contact simulations or structural analysis. In FIG. 8, for each hexahedral element, the contribution to the external force vector and stiffness matrix is calculated in Step S2. The contribution to the external force vector and stiffness matrix is added into the tetrahedral force vector and stiffness matrix, respectively, in Step S4.

For the tetrahedral element, the hourglass force vector and hourglass stiffness matrix are calculated in Step S6. The hourglass force vector and hourglass stiffness matrix are added into the force vector and stiffness matrix in Step S8. If appropriate, the lumped element mass matrix is generated for each sub-element in Step S10, and the lumped sub-element mass matrices are added into the lumped tetrahedral element mass matrix in Step S12.

If body loads or surface pressures are applied to the element in Step S14 (optional), equivalent nodal loads and load stiffnesses are computed in the usual way in Step S16 (optional). The above results are then used in determining structural integrity, including characteristics relating to displacement, natural frequency, stresses, stiffness and the like of the structure.

Figure 9:
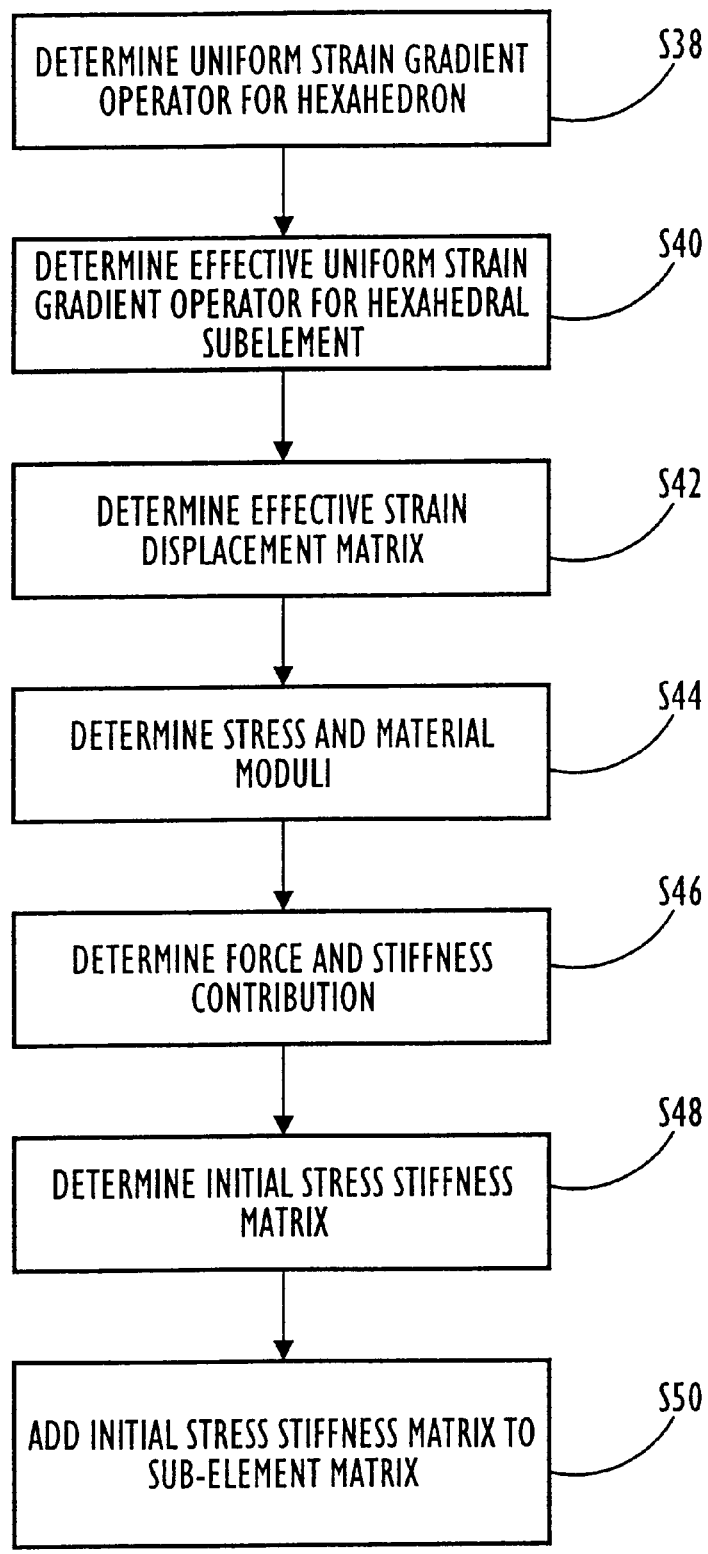
FIG. 9 is an illustration of the computer process for the implementation of the determination and use of the external force vector and stiffness matrix of a hexahedral sub-element illustrated in FIG. 8.

FIG. 9 is an illustration of the computer process for the implementation of the determination and use of the external force vector and stiffness matrix illustrated in FIG. 8. In FIG. 9, the uniform strain gradient operator for the hexahedron $\overline{\delta N_I/\delta x}$ is calculated in Step S38. With equation (7) and similar expressions for the other components, the effective uniform strain gradient operator $\overline{\delta N_I^{\mathit{eff}}/\delta x}$ is obtained in Step S40. From the effective uniform strain gradient operator, the effective strain displacement matrix $B_I^{\mathit{eff}}$ is constructed using the usual procedure in Step S42.

From the material behavior laws, the stress $\sigma^{SE}$ and the material moduli $D^{SE}$ are calculated in Step S44. From the deformed shape of the sub-element, the current sub-element volume $v^{se}$ is calculated in the standard manner. With the above quantities, the force contribution $B_I^{\mathit{eff}}\sigma^{se}v^{se}$ and the stiffness contribution $B_I^{\mathit{eff}}D^{se}B_J^{\mathit{eff}}v^{se}$ are determined in Step S46. With the effective uniform strain gradient operator, the initial stress stiffness matrix $K_{IJ}^{\sigma}$ is calculated in Step S48, and added to the sub-element stiffness matrix calculated above in Step S50.

Figure 10:
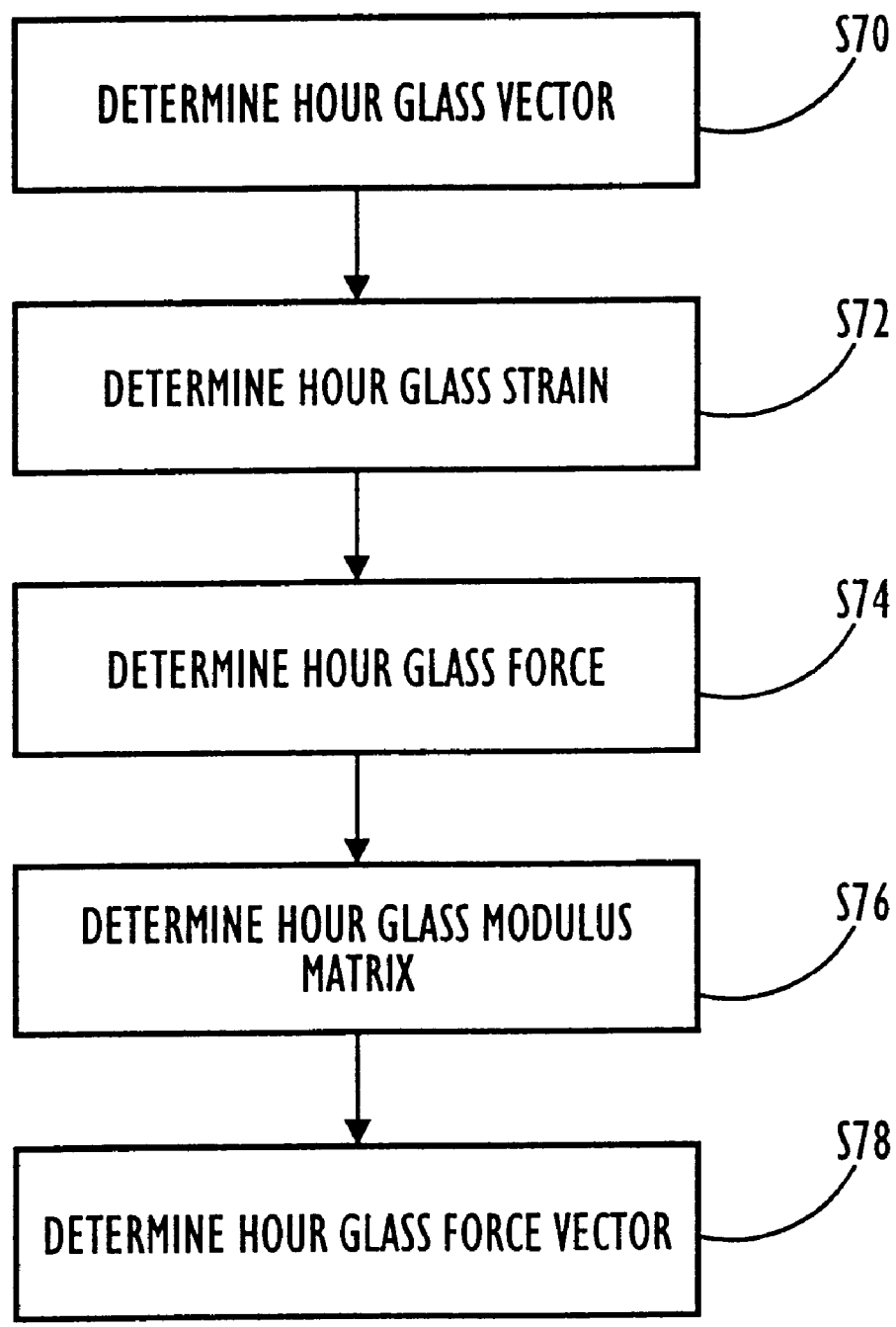
FIG. 10 is an illustration of the computer process for the implementation of the determination and use of the hourglass force vector and hourglass stiffness matrix illustrated in FIG. 8.

FIG. 10 is an illustration of the computer process for the implementation of the determination and use of the hourglass force vector and hourglass stiffness matrix illustrated in FIG. 8. In FIG. 10, the hourglass vector $\Gamma_I$, is formed in Step S70. The hourglass strain $\Delta x^{HG}$ is calculated with equation (9) in Step S72. The hourglass force $F^{HG}$ is calculated with equation (10) in Step S74. In Step S76, the hourglass modulus matrix $D^{HG}$ is calculated with equation (12). In Step S78, the hourglass force vector $P_I^{HG}$ and hourglass stiffness matrix $K_{IJ}^{HG}$ are formed with equations (11) and (13).

Figure 11:
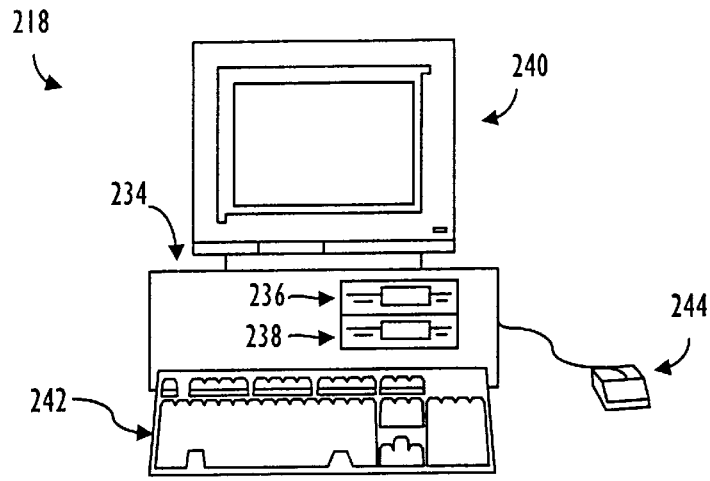
FIG. 11 is an illustration of a main central processing unit for implementing the computer processing.

FIG. 11 is an illustration of computer system 218 for implementing the computer processing in accordance with one embodiment of the present invention. In FIG. 11, computer system 218 includes central processing unit 234 having disk drives 236 and 238. Disk drive indications 236 and 238 are merely symbolic of the number of disk drives which might be accommodated in this computer system. Typically, these would include a floppy disk drive such as 236, a hard disk drive (not shown either internally or externally) and a CD ROM indicated by slot 238. The number and type of drives varies, typically with different computer configurations. The computer includes display 240 upon which information is displayed. A keyboard 242 and a mouse 244 are typically also available as input devices via a standard interface.

Figure 12:
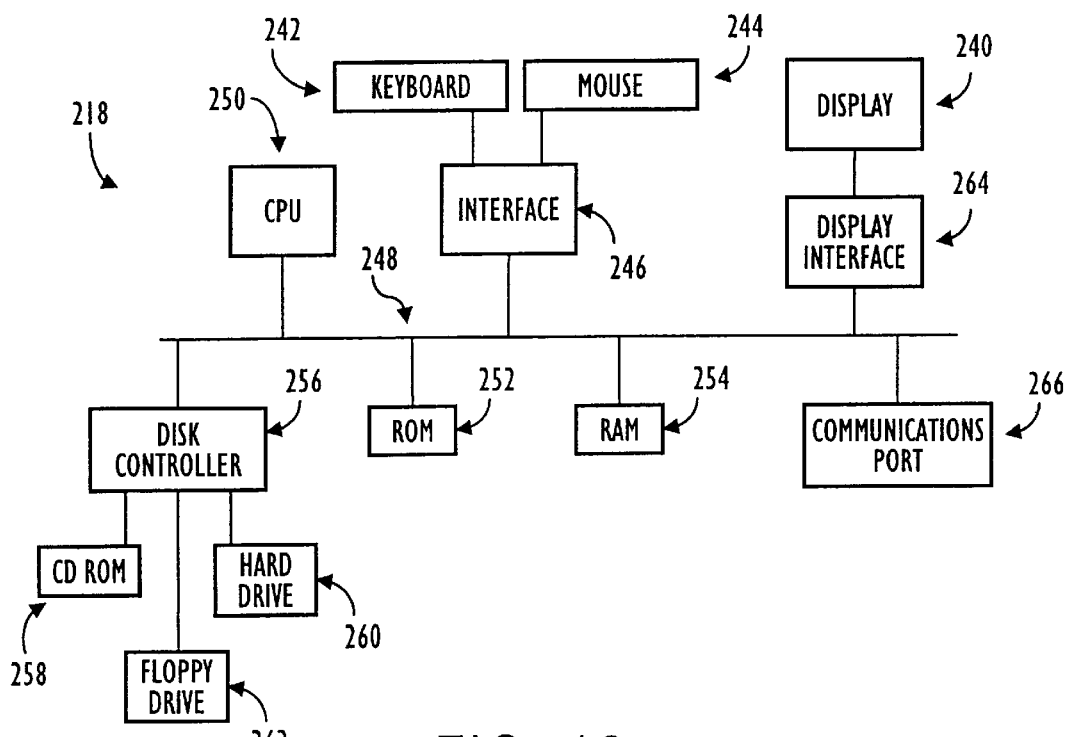
FIG. 12 is a block diagram of the internal hardware of the computer illustrated in FIG. 11.

FIG. 12 is a block diagram of the internal hardware of the computer 218 illustrated in FIG. 11. As illustrated in FIG. 12, data bus 248 serves as the main information highway interconnecting the other components of the computer system. Central processing units (CPU) 250 is the central processing unit of the system performing calculations and logic operations required to execute a program. Read-only memory 252 and random access memory 254 constitute the main memory of the computer, and may be used to store the simulation data.

Disk controller 256 interfaces one or more disk drives to the system bus 248. These disk drives may be floppy disk drives such as 262, internal or external hard drives such as 260, or CD ROM or DVD (digital video disks) drives such as 258. A display interface 264 interfaces with display 240 and permits information from the bus 248 to be displayed on the display 240. Communications with the external devices can occur on communications port 266.

Figure 13:
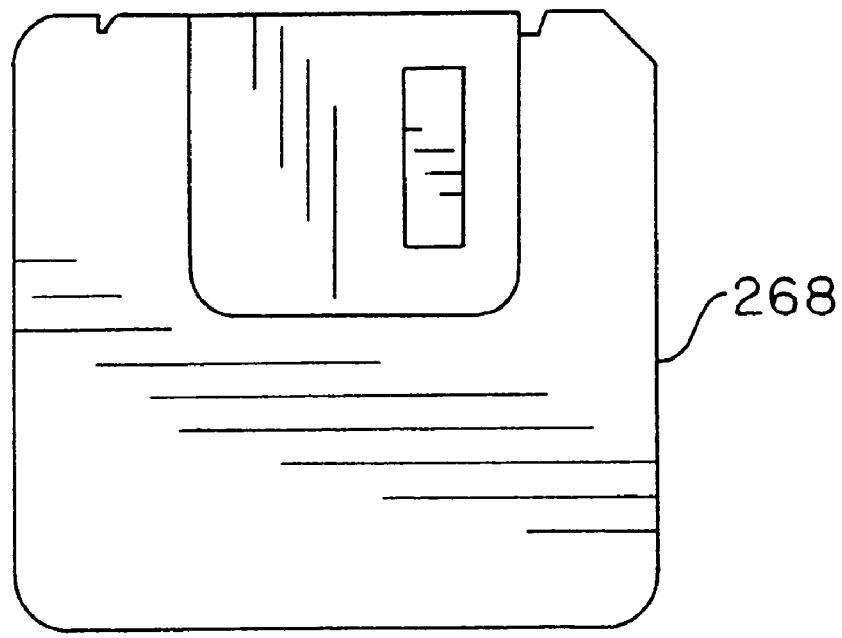
FIG. 13 is an illustration of an exemplary memory medium which can be used with disk drives illustrated in FIG. 11 or FIG. 12.

FIG. 13 is an illustration of an exemplary memory medium which can be used with disk drives such as 262 in FIG. 12 or 236 in FIG. 11. Typically, memory media such as a floppy disk, or a CD ROM, or a digital video disk will contain, inter alia, the program information for controlling the computer to enable the computer to perform the testing and development functions in accordance with the computer system described herein.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

For example, the specific sequence of the above described process may be altered so that certain processes are conducted in parallel or independent, with other processes, to the extent that the processes are not dependent upon each other. Thus, the specific order of steps described herein are not to be considered implying a specific sequence of steps to perform the above described process. Other alterations or modifications of the above processes are also contemplated.

For example, further insubstantial approximations of the above equations are also considered within the scope of the processes described herein.

What is claimed is:

1. A computer implemented and user assisted process for prescribing second-order tetrahedral elements during simulation for assisting in the design analysis of a structure by a user, comprising the steps of:
    (a) defining, by the user, a finite element model for an element of the structure including at least one tetrahedral element;
    (b) defining, by the user, at least one node of the at least one tetrahedral element;
    (c) defining, by at least one of the computer and the user, the at least one tetrahedral element as a combination of first order hexahedral sub-elements and defining at least one sub-element node of at least one of the hexahedral sub-elements using the at least one node;
    (d) executing, by the computer, the simulation using the combination of first order hexahedral sub-elements;
    (e) evaluating, by at least one of the computer and the user, and redesigning by the user the structure responsive to said executing step (d) for structural integrity.

2. A computer implemented process according to claim 1, wherein said evaluating step (e) provides information usable to assist in a redesign of the structure with respect to structural integrity.

3. A computer implemented process according to claim 1, wherein said executing step (d) comprises the step of executing a deformation simulation.

4. A computer implemented process according to claim 1, wherein said executing step (d) comprises the step of executing the simulation resulting in substantially uniform contact forces and pressures experienced by the at least one tetrahedral element.

5. A computer implemented process according to claim 1, wherein said executing step (d) comprises the step of executing the simulation resulting in substantially minimal shear and volumetric locking.

6. A computer implemented process according to claim 1, wherein said executing step (d) comprises the step of executing the simulation resulting in the at least one tetrahedral element providing a substantially robust simulation during snmall or finite deformation.

7. A computer implemented process according to claim 1, wherein said defining step (a) comprises the step of defining the finite element model for the element including at least one tetrahedral element for three-dimensional analysis.

8. A computer implemented process according to claim 1, wherein said defining step (a) comprises the step of defining the finite element model for the element including at least one hybrid version of the at least one tetrahedral element for use with incompressible and substantially incompressible constitutive finite element models.

9. A computer implemented process according to claim 1, wherein said defining step (b) comprises the step of defining the at least one tetrahedral element as a combination of the hexahedral sub-elements, wherein the user specifies nodes of the tetrahedral element, and wherein said defining step (c) comprises the step of the computer implemented process generating nodes of the hexahedral sub-elements and a midbody node of the hexahedral sub-elements for the simulation.

10. A computer implemented process according to claim 9, wherein the computer implemented process generates the nodes of the hexahedral sub-elements as substantially mid-face nodes of the at least one tetrahedral element.

11. A computer implemented process according to claim 9, wherein the user specified nodes and the midbody node of the tetrahedral element are substantially unconstrained during the simulation to facilitate convergence.

12. A computer implemented process according to claim 9, wherein the midface nodes of the tetrahedral element are substantially constrained during the simulation to facilitate convergence.

13. A computer implemented process according to claim 9, wherein the midbody node of the tetrahedral element is substantially controlled using an hourglass control during the simulation to facilitate convergence.

14. A computer implemented process according to claim 1, wherein said executing step (d) comprises the step of executing the simulation including constructing a mass matrix to apply uniform nodal masses to the at least one tetrahedral element during the simulation.

15. A computer implemented process according to claim 9, wherein the computer implemented process condenses the degrees of freedom of the midbody node for the tetrahedral element to promote computational efficiency.

16. A computer readable tangible medium storing instructions for implementing a computer implemented and user assisted process by a computer, the instructions controlling the computer to perform the computer implemented and user assisted process of prescribing second-order tetrahedral elements during simulation for assisting in the design analysis of a structure by a user, said computer readable tangible medium storing the instructions to implement the following:

(a) defining, by the user with the assistance of the computer, a finite element model for an element of the structure including at least one tetrahedral element;

(b) defining, by the user with the assistance of the computer, the at least one tetrahedral element as a combination of first order hexahedral sub-elements by defining nodes including at least one corner node, a midbody node, a midface node and a midedge node of the tetrahedral element;

(c) executing, by the computer, the simulation and substantially constraining the midface node of the tetrahedral element during the simulation to facilitate convergence; and (d) evaluating, by the user with the assistance of the computer and redesigning by the user the structure with respect to said executing step (c) for structural integrity.

17. A computer readable tangible medium according to claim 16, wherein said defining step (b) comprises the step of defining the at least one tetrahedral element as the combination of the hexahedral sub-elements, wherein a user specifies the nodes of the tetrahedral element and the process generates the midface nodes and the midbody node of the tetrahedral element for the simulation.

18. A computer readable tangible medium according to claim 16, wherein the process generates the nodes of the hexahedral sub-elements using the corner nodes, the midedge nodes, substantially midface nodes, and substantially midbody nodes of the at least one tetrahedral element.

19. A computer readable tangible medium according to claim 16, wherein the corner, midedge and midbody nodes of the tetrahedral element are substantially unconstrained during the simulation to facilitate convergence.

20. A computer readable tangible medium according to claim 16, wherein the midface nodes of the tetrahedral element are substantially constrained during the simulation to facilitate convergence.

21. A computer readable tangible medium according to claim 16, wherein the midbody node of the tetrahedral element is substantially controlled using an hourglass control during the simulation to facilitate convergence.

22. A computer readable tangible medium according to claim 21, wherein the midbody node of the tetrahedral element that is substantially constrained using the hourglass control during the simulation to facilitate convergence is transparent to a user.

23. A computer readable tangible medium according to claim 16, wherein the midbody and midface nodes of the tetrahedral element defining the combination of the hexahedral sub-elements are transparent to a user.

24. The computer implemented process according to claim 1, wherein the at least one sub-element node is transparent to the user.

25. A computer implemented and user assisted process for prescribing second-order tetrahedral elements during simulation for assisting the design analysis and subsequent building of a structure by a user, the process comprising the steps of:

(a) defining a finite element model for an element of the structure including at least one tetrahedral element;

(b) defining at least one node of the at least one tetrahedral element;

(c) defining the at least one tetrahedral element as a combination of first order hexahedral sub-elements and defining at least one sub-element node of at least one of the hexahedral sub-elements using the at least one node;

(d) executing the simulation using the combination of first order hexahedral sub-elements;

(e) evaluating the structure responsive to said executing step (d) for structural integrity; and (f) building the structure responsive to said evaluating step (e).

* * * * *